US009112489B2

(12) United States Patent
Priel et al.

(10) Patent No.: US 9,112,489 B2
(45) Date of Patent: Aug. 18, 2015

(54) SEQUENTIAL LOGIC CIRCUIT AND METHOD OF PROVIDING SETUP TIMING VIOLATION TOLERANCE THEREFOR

(75) Inventors: Michael Priel, Netanya (IL); Leonid Fleshel, Hertzelia (IL); Anton Rozen, Gedera (IL)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/398,868

(22) PCT Filed: May 30, 2012

(86) PCT No.: PCT/IB2012/052700
§ 371 (c)(1),
(2), (4) Date: Nov. 4, 2014

(87) PCT Pub. No.: WO2013/179089
PCT Pub. Date: Dec. 5, 2013

(65) Prior Publication Data
US 2015/0091607 A1  Apr. 2, 2015

(51) Int. Cl.
*H03K 19/00* (2006.01)
*H03K 19/003* (2006.01)
(Continued)

(52) U.S. Cl.
CPC ............ *H03K 19/0016* (2013.01); *H03K 5/135* (2013.01); *H03K 19/00323* (2013.01); *H03K 19/00369* (2013.01); *H03K 19/173* (2013.01)

(58) Field of Classification Search
None
See application file for complete search history.

(56) References Cited

U.S. PATENT DOCUMENTS 6,300,809 B1   10/2001  Gregor
6,438,023 B1   8/2002   Johnson
(Continued)

OTHER PUBLICATIONS

International Search Report and Written Opinion correlating to PCT/IB2012/052700 dated Feb. 28, 2013.
(Continued)

*Primary Examiner* — Crystal L Hammond

(57) ABSTRACT

A sequential logic circuit comprising a first latch component comprising a data input arranged to receive an input signal, a data output arranged to output a current logical state of the first latch component and a clock input arranged to receive a clock signal; the first latch component being arranged to comprise a transparent state upon the clock signal received thereby comprising a first logical state, and to comprise a latched state upon the clock signal received thereby comprising a second logical state, and a second latch component comprising a data input arranged to receive an input signal, a data output operably coupled to an output of the sequential logic circuit and arranged to output a current state of the second latch component and a clock input arranged to receive a clock signal; the second latch component being arranged to comprise a transparent state upon the clock signal received thereby comprising a second logical state, and to comprise a latched state upon the clock signal received thereby comprising a first logical state. The sequential logic circuit is arranged to operate in at least a first operating mode in which the data input of the first latch component and the data input of the second latch component are operably coupled to a first input of the sequential logic circuit, and in which the clock signals provided to the first and second latch components are such that a transition of the second latch component from a transparent state to a latched state is delayed relative to a corresponding transition of the first latch component from a transparent state to a latched state for a time period for receiving late data.

17 Claims, 4 Drawing Sheets

(51) Int. Cl.
*H03K 19/173* (2006.01)
*H03K 5/135* (2006.01)

(56) References Cited

U.S. PATENT DOCUMENTS

| | | | |
|---|---|---|---|
| 7,375,571 B1 * | 5/2008 | Tiffany | 327/298 |
| 7,671,653 B2 * | 3/2010 | Harris et al. | 327/218 |
| 7,924,078 B2 * | 4/2011 | Clerc | 327/211 |
| 2006/0152267 A1 | 7/2006 | Ramprasad | |
| 2011/0228626 A1 | 9/2011 | Roth | |

OTHER PUBLICATIONS

Kaul, Himanshu et al: "DVS for On-Chip Bus Designs Based on Timing Error Correction", The Computer Society, Proceedings of the Design, Automation and Test in Europe Conference and Exhibition (DATE'05), pp. 1-6.

* cited by examiner

SEQUENTIAL LOGIC CIRCUIT AND METHOD OF PROVIDING SETUP TIMING VIOLATION TOLERANCE THEREFOR

FIELD OF THE INVENTION

The field of this invention relates to a sequential logic circuit and a method of providing setup timing violation tolerance within a sequential logic circuit.

BACKGROUND OF THE INVENTION

Modern integrated circuit (IC) devices are often required to provide high speed performance, whilst also providing low power consumption. To meet this two conflicting requirements, power management techniques are typically implemented to enable an IC device to be configured to operate in a plurality of modes depending on the current system requirements. For example, an IC device may be configurable to operate in a high speed (high power consumption) mode when high performance is required/desired, and to operate in a low power consumption (low speed) mode when reduced power consumption is required/desired, and/or when high performance is not required.

A challenge faced when designing digital synchronous systems is to maximise the operating speeds of the digital components whilst ensuring setup and timing violations are avoided. This challenge is particularly difficult when implementing a power management technique, since the operating conditions (e.g. voltage, etc.) that affect the ability of a digital system to operate at a certain speed are not constant. Accordingly, it is known to implement setup violation tolerant designs that are able to tolerate minor setup and timing violations.

Razor latches are one example of such a setup violation design, with the setup violation tolerant design of these latches enabling them to remain one of the most aggressive power management techniques currently in use. FIG. 1 illustrates a simplified block diagram of an example of a typical Razor latch design 100. FIG. 2 illustrates a gate level circuit diagram of the Razor latch 100 of FIG. 1. Typically, such Razor latches 100 may be provided within critical paths of an IC device, and often a plurality of such latches may be provided sequentially within a critical path. Each Razor latch 100 comprises a main flip-flop 110 arranged to receive input data 115 during normal operation of the Razor latch 100, and to sample and latch the input data 115 upon an active edge (e.g. rising edge) of a clock signal 120. The Razor latch 100 further comprises a shadow latch 125 also arranged to receive the input data 115 during normal operation of the Razor latch 100. However, the shadow latch 125 is arranged to sample and latch the input data 115 upon an active edge of a clock signal that is delayed with respect to that of the main flip-flop 110. In the illustrated example, this is achieved by way of the shadow latch 125 sampling and latching the input data 115 on the opposing edge of the clock signal 120 to that of the main flip-flop 110 (e.g. the falling edge). The outputs of the main flip-flop 110 and the shadow latch 125 are provided to a comparator 130, which is arranged to output an error signal upon a mismatch being detected between the outputs of the main flip-flop 110 and the shadow latch 125.

In this manner, if data arrives late on the input signal 115, the late data will not be sampled in time by the main flip-flop 110. As such, the main flip-flop 110 will output the 'old' data, resulting in a setup timing violation. However, because the shadow latch 125 is arranged to sample and latch the input signal data on a delayed clock edge, assuming the late data is received prior to this late clock edge, the shadow latch 125 will sample and latch the late, 'new' data. As such, the output of the shadow latch 125 will differ from the output of the main flip-flop 110 (assuming the late data comprises a change of state), which will cause the comparator 130 to output an error signal indicating the detection of late data at the input signal 115.

In the illustrated example, the Razor latch 100 further comprises a local meta detector arranged to detect meta-stability in the output of the main flip-flop 110, for example as a result of a rising clock edge and a data signal arriving at the input thereof substantially simultaneously, and to output an error signal upon detection of such meta-stability. The outputs of the local meta detector 135 and the comparator 130 are provided to an OR gate 140, which outputs an error signal indicating an error within the Razor latch 100 caused by either the late receipt of input data or by meta-stability at the output of the main flip-flop 110.

The error signals generated by each Razor latch 100 within a signal path may then be provided to a further OR gate 145, which may then output a restore signal 150 arranged to indicate whenever one of the Razor latches 100 within the signal path detects an error. This restore signal 150 may then be fed back to a multiplexor 160 within each Razor latch 100 in the signal path to cause the output value of the respective shadow latch 125 to replace the input signal 115. In this manner, the Razor latch 100 is held in its current correct state (i.e. even if late data is received, this 'correct' data is used). In this manner, the signal path is allowed to stabilize following a setup timing violation.

The restore signal 150 may further be used to indicate to a clock driver that a setup timing violation has been detected. For example, and as illustrated in FIG. 3, upon detection of a setup timing violation at a first Razor latch 310, the error signal output by the Razor latch 310 is propagated through an error detect tree to the clock driver 320. Upon receipt of the error signal, the clock driver 320 may then delay the next clock edge to allow the signal path to stabilise following the detection of a setup timing violation, and to prevent corrupted data from propagating to the next latch 330 along the signal path. The clock driver 320 may also be arranged to reconfigure the clock frequency to a lower clock frequency in order to prevent such setup timing violations occurring again. Alternatively, if such setup timing violations occur only occasionally at the current clock frequency, it may be deemed acceptable for the occasional setup timing violation to occur (and be recovered from as described above) in order to achieve a higher system operating frequency.

A problem with the use of such Razor latches in this manner to recover from setup timing violations is that the clock edge immediately following a setup timing violation must be postponed in order to enable late data to stabilize, and the short window of opportunity for postponing the next clock edge. In particular, where the system comprises a large error detection tree 350 and a large clock tree 360, the window of opportunity for delaying the next clock edge is made even shorter due to the time required for the signals to propagate through these trees. For example, the use of a Razor latch at a downstream end of a signal path may be made unfeasible due to there being insufficient time between the detection of a setup timing violation at that latch, and the ability to delay the next clock edge for latches located towards the upstream end of the signal path.

SUMMARY OF THE INVENTION

The present invention provides a sequential logic circuit, digital synchronous system comprising at least one such sequential logic circuit, and a method of providing setup timing violation tolerance within a sequential logic circuit as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

An example of the present invention will now be described with reference to the accompanying drawings. Because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Is some examples of the present invention, there is provided a sequential logic circuit. The sequential logic circuit comprises a first latch component comprising a data input arranged to receive an input signal, a data output arranged to output a current logical state of the first latch component and a clock input arranged to receive a clock signal; the first latch component being arranged to comprise a transparent state upon the clock signal received thereby comprising a first logical state, and to comprise a latched state upon the clock signal received thereby comprising a second logical state. The sequential logic circuit further comprises a second latch component comprising a data input arranged to receive an input signal, a data output operably coupled to an output of the sequential logic circuit and arranged to output a current state of the second latch component and a clock input arranged to receive a clock signal; the second latch component being arranged to comprise a transparent state upon the clock signal received thereby comprising a second logical state, and to comprise a latched state upon the clock signal received thereby comprising a first logical state. The sequential logic circuit is arranged to operate in at least a first operating mode in which the data input of the first latch component and the data input of the second latch component are operably coupled to a first input of the sequential logic circuit, and in which the clock signals provided to the first and second latch components are such that a transition of the second latch component from a transparent state to a latched state is delayed relative to a corresponding transition of the first latch component from a transparent state to a latched state for a time period for receiving late data.

Figure 1:
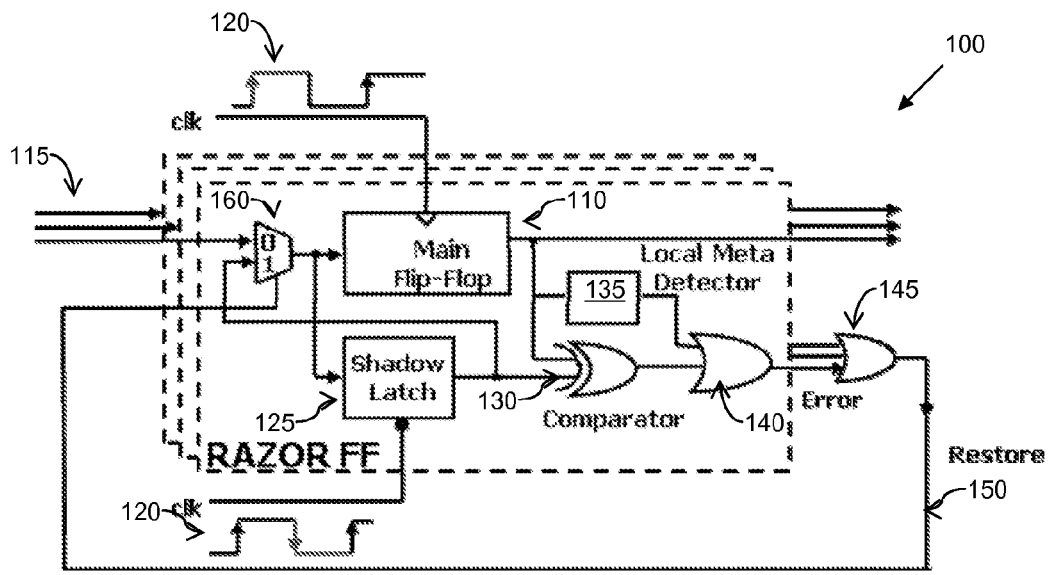
FIG. 1 illustrates a simplified block diagram of an example of a typical Razor latch design.
Figure 2:
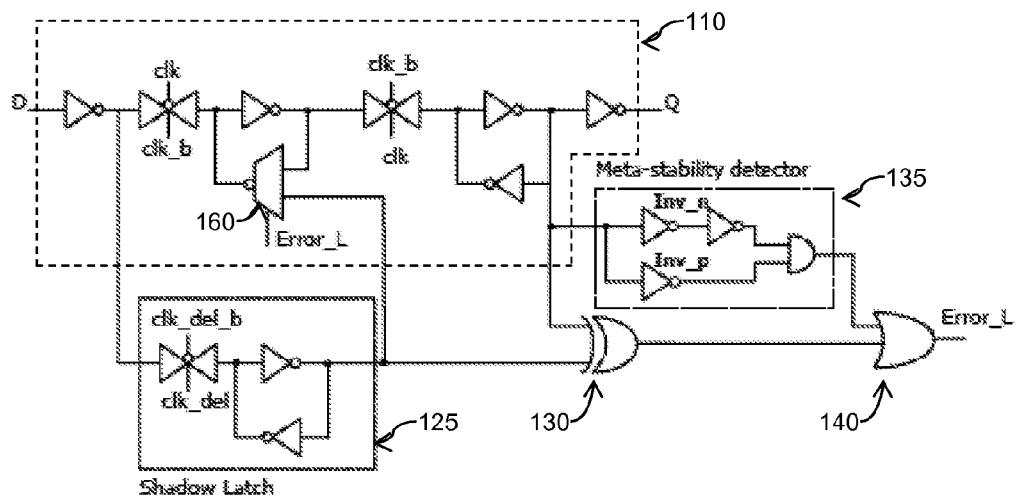
FIG. 2 illustrates a gate level circuit diagram of the Razor latch of FIG. 1.
Figure 3:
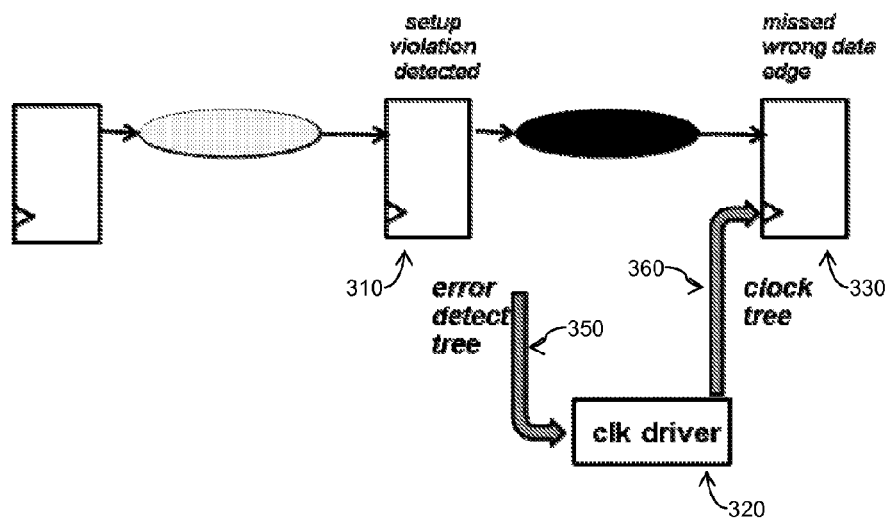
FIG. 3 illustrates a simplified block diagram of a signal path within a digital synchronous system comprising Razor latches.
Figure 4:
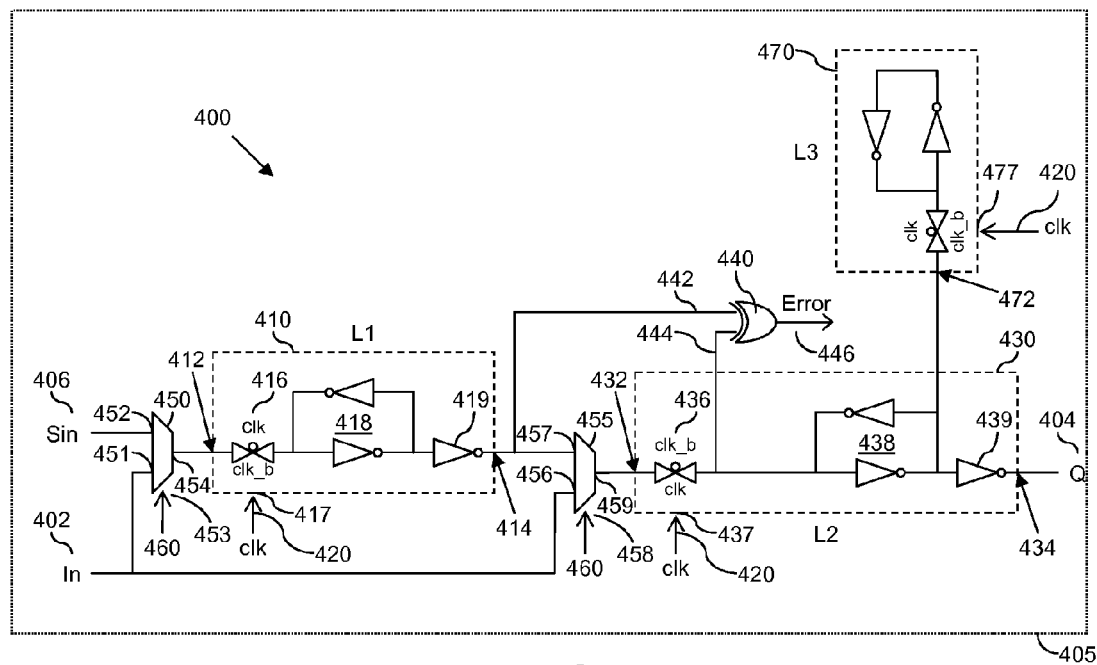
FIG. 4 illustrates a simplified circuit diagram of an example of a sequential logic circuit.

Referring first to FIG. 4, there is illustrated a simplified circuit diagram of an example of such a sequential logic circuit 400 according to some embodiments of the present invention, which may may be implemented within an integrated circuit device 405 comprising at least one die within a single integrated circuit package. The sequential logic circuit 400 comprises a first latch component 410 comprising a data input 412 arranged to receive an input signal, and a data output 414 arranged to output a current logical state of the first latch component 410; for example either a logical '1' (high) state or a logical '0' (low) state. The first latch component 410 is further arranged to receive at a clock input 417 thereof a clock signal 420, and is arranged to comprise a transparent state upon the clock signal 420 comprising a first logical state, and to comprise a latched state upon the clock signal 420 comprising a second logical state. For clarity, when the first latch component 410 of the illustrated example is in a transparent state, the current logical state of the first latch component 410 is determined by the logical state of an input signal received at the data input 412 thereof. As such, when the first latch component 410 of the illustrated example is in a transparent state, the data output 414 of the first latch component 410 outputs a logical state equal to the logical state of an input signal received at the data input 412. Conversely, when the first latch component 410 of the illustrated example is in a latched state, the current logical state of the first latch component 410 is 'latched' and maintained irrespective of the logical state of an input signal received at the data input 412 thereof.

In this manner, when the clock signal 420 comprises the first logical state (e.g. a low logical state in one example) the first latch component 410 comprises a transparent state such that the current logical state of the first latch component 410 is equal to the current logical state of the input signal received at the data input 412 thereof. Accordingly, the signal output by the data output 414 of the first latch component 410 is also equal to the current logical state of the input signal received at the data input 412. Conversely, when the clock signal 420 transitions to the second logical state (e.g. a high logical state in the one example) the first latch component 410 comprises a latched state, wherein the logical state of the input signal received at the data input 412 is sampled and latched within the first latch component 410. Accordingly, whilst in this latched state, the current logical state of the first latch component 410 will remain equal to the last sampled logical state of the input signal received at the data input 412 upon the transitioning of the clock signal from the first logical state to the second logical state (e.g. on a rising clock edge in the one example), and the signal output by the data output 414 of the first latch component 410 will be equal to this sampled and latched logical state.

For completeness, the first latch component 410 illustrated in FIG. 4 comprises a clocked transfer gate 416 arranged to comprise an 'open' (transparent) configuration when the clock signal 420 comprises the first logical state and a 'closed' configuration when the clock signal 420 comprises the second logical state. The clocked transfer gate 416 is operably coupled between the data input 412 of the first latch component 410 and a latch circuit 418 comprising, in the illustrated example, a pair of cross-coupled inverting elements operably coupled in series. A further inverting element 419 is operably between the latch circuit 418 and the data output 414 to counter the inverting effect of the latch circuit 418. Such a latch implementation is well known to those skilled in the art, and thus will not be described in any greater detail herein.

The sequential logic circuit 400 comprises a second latch component 430 comprising a data input 432 arranged to receive an input signal, and a data output 434 arranged to output a current logical state of the second latch component 430. The output 434 of the second latch component 430 is operably coupled to (i.e. provides) an output 404 of the sequential logic circuit 400. The second latch component 430 is further arranged to receive at a clock input 437 thereof a clock signal, and is arranged to comprise a transparent state upon the clock signal received thereby comprising a second logical state, and to comprise a latched state upon the clock signal received thereby comprising a first logical state. For clarity, and as for the first latch component 410, when the second latch component 430 of the illustrated example is in a transparent state, the current logical state of the second latch component 430 is determined by the logical state of an input signal received at the data input 432 thereof. As such, when the second latch component 430 of the illustrated example is in a transparent state, the data output 434 of the second latch component 430 outputs a logical state equal to the logical state of an input signal received at the data input 432. Conversely, when the second latch component 430 of the illustrated example is in a latched state, the current logical state of the second latch component 430 is 'latched' and maintained irrespective of the logical state of an input signal received at the data input 432 thereof.

As described in greater detail below, the clock signals provided to the first and second latch components 410, 430 are such that a transition of the second latch component 430 from a transparent state to a latched state is delayed relative to a corresponding transition of the first latch component 410 from a transparent state to a latched state for a time period for receiving late data. In the illustrated example, this is achieved by way of the second latch component 430 being arranged to receive the same clock signal 420 as received by the first latch component 410, but being arranged to comprise transparent and latched states upon opposing logical states of the clock signal 420 relative to the first latch component 410. Accordingly, a time period for receiving late data is provided comprising, in this example, a duty cycle of the clock signal 420 (e.g. a half a clock cycle for a symmetrical clock signal 420). It will be appreciated that any other suitable arrangement of clock signals for the latch components 410, 420 may be implemented for providing a suitable delay time period for receiving late data, whereby such a time period is sufficiently long to allow late data to be received (and detected as described below), whilst sufficiently short (relative to a duration of a clock cycle) to provide a suitably long subsequent time period within the same clock cycle to receive new data.

In this manner, when the clock signal 420 comprises the second logical state (e.g. a high logical state in the one example) the second latch component 430 comprises a transparent state such that the current logical state of the second latch component 430 is equal to the current logical state of the input signal received at the data input 432. Accordingly, the signal output by the data output 434 of the second latch component 430 is also equal to the current logical state of the input signal received at the data input 432 of the second latch component 430. Conversely, when the clock signal 420 transitions to the first logical state (e.g. a low logical state in the one example) the second latch component 430 comprises a latched state, wherein the logical state of the input signal received at the data input 432 is sampled and latched within the second latch component 430. Accordingly, whilst in this latched state, the current logical state of the second latch component 430 will remain equal to the sampled logical state of the input signal received at the data input 432 upon the transitioning of the clock signal 420 from the second logical state thereof to the first logical state thereof (e.g. on a falling clock edge in this example), and the signal output by the data output 434 of the second latch component 430 will be equal to this sampled and latched logical state.

For completeness, the second latch component 430 illustrated in FIG. 4 comprises a clocked transfer gate 436 arranged to comprise an 'open' (transparent) configuration when the clock signal 420 comprises the second logical state and a 'closed' configuration when the clock signal 420 comprises the first logical state. The clocked transfer gate 436 is operably coupled between the data input 432 of the second latch component 430 and a latch circuit 438 comprising a pair of cross-coupled inverting elements. A further inverting element 439 is operably between the latch circuit 438 and the data output 434 to counter the inverting effect of the latch circuit 438. As mentioned above, such a latch implementation is well known to those skilled in the art, and thus will not be described in any greater detail herein. Furthermore, it will be appreciated that the present invention is not limited to the specific latch implementations illustrated in the accompanying drawings and described herein. Accordingly, it is contemplated that the first and second latch components 410, 430 may be implemented by way of any suitable alternative latch circuits, for example comprising NOR gates and/or NAND gates as are well known in the art.

The sequential logic circuit 400 of FIG. 4 is arranged to operate in a first operating mode in which the data input 412 of the first latch component 410 and the data input 432 of the second latch component 430 are operably coupled to a first input 402 of the sequential logic circuit 400. In particular in the illustrated example, the data input 412 of the first latch component 410 is operably coupled to the first input 402 of the sequential logic circuit 400 via a first multiplexer component 450. The first multiplexer component 450 comprises a first data input 451 operably coupled to the first input 402 of the sequential logic circuit 400, a second data input 452 operably coupled to a second input 406 of the sequential logic circuit 400, an output 454 operably coupled to the data input 412 of the first latch component 410, and a control input 453 arranged to receive a control signal 460. The first multiplexer component 450 is arranged to selectively output to the first latch component 410 a logical state of one of the first input 402 of the sequential logic circuit 400 and the second input 406 of the sequential logic circuit 400 in accordance with the control signal 460 received thereby.

Similarly, the data input 432 of the second latch component 430 is operably coupled to the first input 402 of the sequential logic circuit 400 via a second multiplexer component 455. The second multiplexer component 455 comprises a first data input 456 operably coupled to the first input 402 of the sequential logic circuit 400, a second data input 457 operably coupled to the output 414 of the first latch component 410, an output 459 operably coupled to the data input 432 of the second latch component 430, and a control input 458 arranged to receive the control signal 460. The second multiplexer component 455 is arranged to selectively output to the second latch component 430 a logical state of one of the first input 402 of the sequential logic circuit 400 and the output 414 of the first latch component 410 in accordance with the control signal 460 received thereby.

In this manner, when the sequential logic circuit 400 is configured to operate in this first operating mode, for example by way of the control signal 460 comprising, say, a logical '0' state, both the first and second latch components 410, 430 receive at their respective inputs 412, 432 a data signal received at the first input 402 of the sequential logic circuit 400. As described above, the first latch component 410 is arranged to sample and latch data received at its input 412 upon a transition of the clock signal 420 from a first logical state (e.g. a low logical state in one example) to a second logical state (e.g. a high logical state in the one example), for example on a rising clock edge. By contrast, the second latch component 430 is arranged to sample and latch data received at its input 432 upon a transition of the clock signal 420 from the second logical state (e.g. a high logical state in the one example) to a first logical state (e.g. a low logical state in the one example), for example on a falling clock edge.

Figure 5:
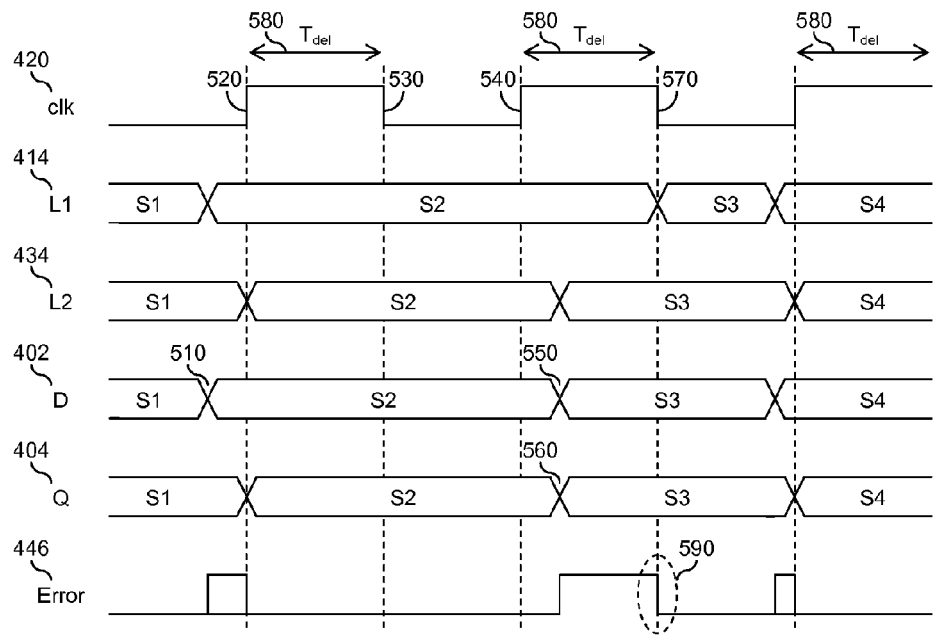
FIG. 5 illustrates a simplified signal timing diagram for the sequential logic circuit of FIG. 4.

Referring now to FIG. 5, there is illustrated a simplified signal timing diagram 500 of an example of signal states within the sequential logic circuit 400 of FIG. 4 when configured to operate in this first operating mode. The clock signal 420 comprises regular transitions between a first logical state, which in the illustrated example comprises a high logical state, and a second logical state, which in the illustrated example comprises a logical low state. In the example illustrated in FIG. 5, the clock signal 420 starts with a low logical state. Accordingly, the first latch component 410 comprises a transparent state. As such the output 414 of the first latch component 410 comprises a logical state equal to the initial logical state (S1) of the input signal 402 of the sequential logic circuit 400. Accordingly, the output 414 of the first latch component 410 initially comprises the logical state S1. The second latch component 430 initially comprises a latched state, due to the clock signal 420 comprising a logical low state. In the example illustrated in FIG. 5, it is assumed that during the previous transition of the clock signal 420 from a high state to a low state, the input signal 402 comprised the logical state S1, which was sampled and latched at that point by the second latch component 430. Accordingly, the output 434 of the second latch component 430 also initially comprises the logical state S1, and thereby so does the output 404 of the sequential logic circuit 400.

In the illustrated example, the sequential logic circuit 400 is arranged to comprise a rising edge triggered flip-flop circuit. As such data is expected to be received in advance of a rising edge within the clock signal 420 (i.e. changes in logical state at the first input 402 of the sequential logic circuit 400 are expected to occur and settle in advance of a transition from a low logical state to a high logical state within the clock signal 420). Such a change in logical state of the first input 402 of the sequential logic circuit 400 from the initial logical state S1 to a second logical state S2 is illustrated at 510. Since the first latch component 410 comprises a transparent state when the change in logical state of the input signal 402 occurs, the output 414 of the first latch component 410 also changes logical state at the same time, from the first logical state S1 to the second logical state S2. However, because the second latch component 430 comprises a latched state, the output 434 of the second latch component 430 remains at the first logical state S1.

Upon a subsequent transition of the clock signal 420 from a low logical state to a high logical state, as illustrated at 520, the first latch component 410 samples and latches the signal received at its input 412; i.e. the first component 410 samples and latches the second logical state S2 of the input signal 402. At the same time, the second latch component 430 switches from a latched state to a transparent state. As such, the output 434 of the second latch component 430 changes from the previously latched first logical state S1 to the second logical state S2 of the input signal 402. In this manner, the output 404 of the sequential logic circuit 400 takes on the current logical state of the input signal 402 upon the rising edge of the clock signal 420.

Upon a subsequent transition of the clock signal 420 from a high logical state back to a low logical state, as illustrated at 530, the first latch component 410 switches from a latched state to a transparent state. However, since no change in logical state has occurred at the input 402 of the sequential logic circuit 400, the output 414 of the first latch component 410 remains at the second logical state S2 of the input signal 402. At the same time, the second latch component 430 samples and latches the signal received at its input 432; i.e. the second logical state S2 of the input signal 402. In this manner, the logical state of the output 404 of the sequential logic circuit 400 is latched at the current logical state of the input signal 402 (S2) until the next rising edge of the clock signal 420. This enables new data to be received at the input 402 of the sequential logic circuit 400 in advance of the next rising edge of the clock signal 420 without affecting the logical state of the output 404 of the sequential logic circuit 400.

Upon a subsequent transition of the clock signal 420 from a low logical state back to a high logical state, as illustrated at 540, the first latch component 410 switches from a transparent state to a latched state. Since no change in logical state has occurred at the input 402 of the sequential logic circuit 400, the output 414 of the first latch component 410 samples and latches the second logical state S2 of the input signal 402 once again. At the same time, the second latch component 430 switches from a latched state to a transparent state. Again, since no change in logical state has occurred at the input 402 of the sequential logic circuit 400, the output 434 of the second latch component 430 remains at the second logical state S2 of the input signal 402.

A subsequent change in logical state of the first input 402 of the sequential logic circuit 400 from the second logical state S2 to a third logical state S3 is illustrated at 550. However, this change in logical state 550 at the input 402 of the sequential logic circuit 400 occurs just after the transition of the clock signal 420 from a low logical state back to a high logical state, as illustrated at 540. As such, this 'late' change in logical state 550 at the input 402 of the sequential logic circuit 400 represents a late arrival of data, and thus comprises a setup timing violation. Accordingly, since the first latch component 410 comprises a latched state when the late change in logical state 550 occurs at the first input 402 of the sequential logic circuit, the output 414 of the first latch component 410 remains latched at the second logical state S2. However, because the second latch component 430 comprises a transparent state when the late change in logical state 550 occurs at the first input 402 of the sequential logic circuit, the output 434 of the second latch component 430 changes from the second logical state S2 to the third logical state S3 substantially simultaneously with the first input 402 of the sequential logic circuit 400. Accordingly, the output 404 of the sequential logic circuit 400 also changes from the second logical state S2 to the third logical state S3 substantially simultaneously with the first input 402 of the sequential logic circuit 400, as illustrated at 560. In this manner, data arriving late at the first input 402 of the sequential logic circuit 400 may be forwarded along a respective signal path substantially immediately upon receipt by the sequential logic circuit 400, despite arriving after the rising edge of the clock signal 420.

Upon a subsequent transition of the clock signal 420 from a high logical state back to a low logical state, as illustrated at 570, the first latch component 410 switches from a latched state to a transparent state. Since a change in logical state 550 has occurred at the input 402 of the sequential logic circuit 400, the output 414 of the first latch component 410 changes from the second logical state S2 to the third logical state S3 of the input signal 402. At the same time, the second latch component 430 samples and latches the signal received at its input 432; i.e. the third logical state S3 of the input signal 402. In this manner, the logical state of the output 404 of the sequential logic circuit 400 is latched at the current (late arriving) logical state of the input signal 402 (S3) until the next rising edge of the clock signal 420.

Thus, in the illustrated example, and as described above in with reference to FIG. 4, the clock signals provided to the first and second latch components 410, 430 are such that a transition of the second latch component 430 from a transparent state to a latched state is delayed relative to a corresponding transition of the first latch component 410 from a transparent state to a latched state for a time period for receiving late data. In the illustrated example, this is achieved by way of the second latch component 430 being arranged to receive the same clock signal 420 as received by the first latch component 410, but being arranged to comprise transparent and latched states upon opposing logical states of the clock signal 420 relative to the first latch component 410. Accordingly, a time period for receiving late data is provided comprising, in this example, a duty cycle of the clock signal 420 (e.g. a half a clock cycle for a symmetrical clock signal 420), as illustrated at 580 in FIG. 5. In this manner, late data that is received within this time period 580 is forwarded substantially immediately along the respective signal path.

Figure 6:
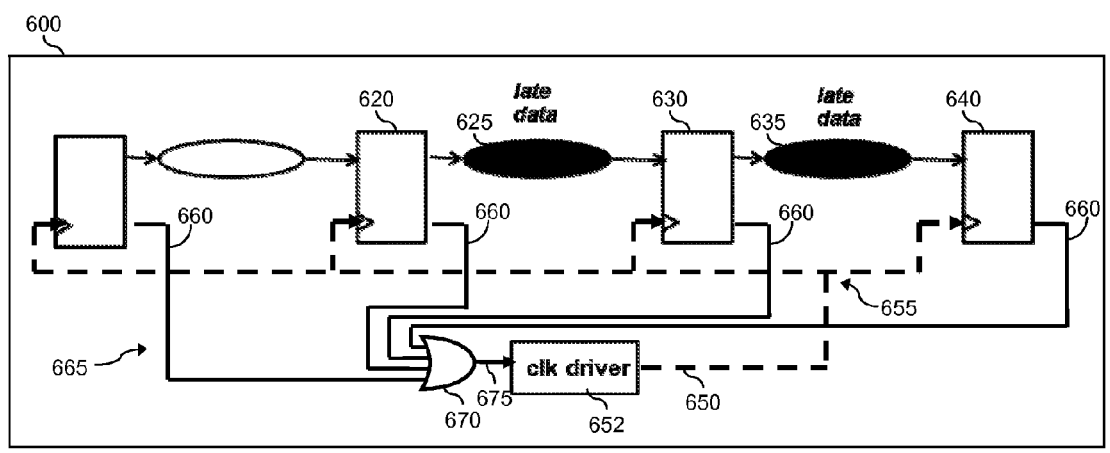
FIG. 6 illustrates a simplified block diagram of an example of a part of a signal path within a synchronous digital system.

Referring now to FIG. 6, there is illustrated a simplified block diagram of an example of a part of a signal path 610 within a synchronous digital system 600. In the illustrated example, the signal path 610 comprises a plurality of sequential logic components, such as those illustrated at 620, 630, 640, one or more of which may be implemented by way of the sequential logic circuit 400 of FIG. 4. The sequential logic components 620, 630, 640 are sequentially coupled one after the other within the signal path 610, and arranged to receive a clock signal 650 output by a clock driver component 652, and propagated to the sequential logic components 620, 630, 640 via a clock distribution network, or tree, 655. The signal path 610 may comprise further logic, such as combinational logic, between each sequential logic component 620, 630, 640, such as illustrated generally at 625, 635.

A data signal is synchronously propagated along the signal path 610 in accordance with the clock signal 650, whereby each sequential logic component 620, 630, 640 is arranged to forward the received data signal to the next sequential logic component 620, 630, 640 upon receipt of, in one example, a rising edge of the clock signal. In this manner, a data signal is propagated from one sequential logic component 620, 630, 640 to the next each clock cycle.

In accordance with some examples of the present invention, whereby sequential logic component 620 is implemented by way of the sequential logic circuit 400 of FIG. 4, if a setup timing violation occurs at sequential logic component 620, whereby a data signal arrives late at an input thereof as described above in relation to FIG. 4, the late data may be forwarded along the signal path 610 substantially immediately to the next sequential logic component 630 upon receipt by the sequential logic component 620. In this manner, even though the data arrived late at the first sequential logic component 620, it is still forwarded on to the second sequential logic component 630 within the relevant clock cycle.

As described in greater detail below, the sequential logic components 620, 630, 640 may be arranged to detect the late arrival of data, and to generate error signals upon detection of the late arrival of data. Accordingly, and as illustrated in FIG. 6, one or more of the sequential logic components 620, 630, 640 may be arranged to output an error signal 660 upon detection of the late arrival of data thereby, with the respective error signals 660 being provided to the clock driver component 652 via an error detect network, or tree, 665. For example, and as illustrated in FIG. 6, the error detect network 665 may comprise an OR gate 670 arranged to receive at inputs thereof error signals 660 output by the sequential logic components 620, 630, 640, and to output to the clock driver component 652 an indication 675 of whether at least one of the sequential logic components 620, 630, 640 within the signal path 610 has detected the late arrival of data.

Upon receipt of such an indication 675 of the detection of the late arrival of data, the clock driver component 652 may postpone a next active clock edge (e.g. rising clock edge in the one example) of the clock signal 650 in order to extend a current clock cycle. In this manner, the signal path 600 is provided with additional time to stabilize after the detection of the late arrival of data at one of the sequential logic components 620, 630, 640. For example, in the example above where a setup timing violation occurs at sequential logic component 620, whereby a data signal arrives late at an input thereof, the late data may be forwarded along the signal path 610 to the next sequential logic component 630 substantially immediately upon receipt by the sequential logic component 620. In this manner, even though the data arrived late at the first sequential logic component 620, it is still forwarded on to the second sequential logic component 630 within the current clock cycle. By delaying the next rising edge of the clock signal 650, thereby extending the current clock cycle, additional time is provided for the late data to propagate from the first second sequential logic component 620 to the second sequential logic component 630, e.g. through the combinational logic 625 there between. In this manner, the late data may be allowed to 'catch up' and reach the second sequential logic component 630 before the end of the (extended) current clock cycle, thereby allowing the signal path 610 to stabilize following the late arrival of data at the first sequential logic component 620. Significantly, because the late data is forwarded substantially immediately within the relevant clock cycle, the correct data may be maintained within the data path 610, albeit slightly delayed relative to the clock signal 650. Additionally, by postponing the clock signal 650 upon detection of late data, the signal path 610 is able to be stabilized to allow late data to catch up, maintaining the integrity of the data within the signal path 610. Accordingly, there is no need to 'flush' the data path 610, or to restore correct data to sections of the data path 610 in order to avoid corrupted data from propagating to other parts of the synchronous digital system 600. Furthermore, because the late data is forwarded substantially immediately within the relevant clock cycle, a clock cycle is not lost in restoring data following a setup timing violation, as is the case with conventional Razor latches, thereby enabling the overall performance of the synchronous digital system 600 to be improved in the event of setup timing violations occurring.

In some examples, the time required for the clock signal 650 and error detect signal 660 to propagate through their respective networks 655, 665 may be such that an insufficiently short window of opportunity for postponing the next clock edge may exist. For example, in the example illustrated in FIG. 6, the arrival of late data may be detected by the first sequential logic component 620. Accordingly, the first sequential logic component 620 forwards the late data on to the second sequential logic component 630, and outputs an error detect signal 660. If the sequential logic components 620, 630 are located at, say, a downstream end of the signal path 610, there may be insufficient time from the detection of the late data at the first sequential logic component 620 for the error detect signal 660 output thereby to propagate through the error detect network 665 to the clock driver component 652 early enough to enable the clock driver component 652 to delay the next clock edge following the detection of the late data for sequential logic components located, say, towards the upstream end of the signal path 610. Accordingly, two (or more) clock cycles may occur between the late arrival of data being detected at one of the sequential logic components 620, 630, 640, and the clock driver component 652 delaying a 'next' clock edge.

In this scenario where there is insufficient time to delay the very next clock edge, if the time required for the late data to propagate from the first sequential logic component 620 to the second sequential logic component 630 is sufficiently short, then the forwarded late data may reach the second sequential logic component 630 in time before the (non-postponed) next clock edge. However, the delay in forwarding the late data to the second sequential logic component 630 may result in that data also arriving late at the second sequential logic component 630, if the next clock edge is not postponed. Nevertheless, in the example illustrated in FIG. 6, if the sequential logic component 630 (and subsequent sequential logic components) is (are) also implemented by way of the sequential logic circuit 400 of FIG. 4, then the late data may also be forwarded on by the second (and subsequent) sequential logic components 630. In this manner, late data arriving may be forwarded through Subsequent sequential logic components implemented by way of the sequential logic circuit 400 of FIG. 4 even though a clock edge has not been postponed. In this manner, the window of opportunity for postponing a clock edge of the clock signal 650 may be extended. For example, by implementing at least the first and second sequential logic components 620, 630 in FIG. 6 by way of the sequential logic circuit 400 of FIG. 4, data arriving late at the first sequential logic component 620 may be forwarded on by the first sequential logic component 620 within the relevant clock cycle. If the forwarded late data also arrives late at the second sequential logic component 630, the delayed data may also be forwarded on by the second sequential logic component 630 within the relevant (subsequent) clock cycle to the third sequential logic component 640. In this manner, the window of opportunity for postponing a clock edge of the clock signal 650 may be extended by a full clock cycle, since it is not necessary to delay a clock edge until the late data reaches third sequential logic component 640. Furthermore, if the third sequential logic component 640 is also implemented by way of the sequential logic circuit 400 of FIG. 4, then that too would be able to forward the late data to a next subsequent sequential logic component (not shown), further extending the window of opportunity for postponing a clock edge of the clock signal 650 by a further full clock cycle.

In this manner, the window of opportunity for postponing a clock edge in order to enable the signal path 610 to stabilize following the detection of late data may be extended by a number of clock cycles, whereby the number of clock cycles up to which the window of opportunity may be extended is equal to the number of subsequent successive sequential logic components capable of forwarding late data (e.g. such as implemented by way of the sequential logic circuit 400 of FIG. 4), located downstream of the sequential logic component at which the late arrival of data is initially detected.

Thus, the sequential logic circuit 400 of FIG. 4 enables a multi-level setup tolerant design in which a sequential logic component implementing the sequential logic circuit 400 of FIG. 4 may be located, say, at a downstream end of a critical path within the synchronous digital system 600. A maximum possible delay for the propagation of error detect signals 660 and the clock signal 650 for (at least) the first sequential logic component 620 may be estimated from static timing analysis for the synchronous digital system 600 to identify a desired/required window of opportunity for postponing a clock edge in order to enable the signal path 610 to stabilize following the detection of late data by the sequential logic component at the downstream end of the critical path. One or more subsequent sequential logic components capable of forwarding late data may then be implemented immediately downstream of the first sequential logic component 620 as required in order to achieve the desired/required window of opportunity for postponing a clock edge.

In particular, the sequential logic circuit 400 of FIG. 4 enables late data to be forwarded along the signal data path, substantially alleviating the need for data recovery following the late arrival of data. Furthermore, a multi-level setup of successive sequential logic components implementing such a sequential logic circuit may be provided to achieve a desired/required window of opportunity for delaying a clock edge in order to stabilize the signal path following the detection of late data.

As mentioned above, the sequential logic components 620, 630, 640 may be arranged to detect the late arrival of data, and to generate error signals upon detection of the late arrival of data. Referring back to FIG. 4, the sequential logic circuit 400 further comprises a comparator component 440, which in the illustrated example comprises an XOR (eXclusive OR) gate. The comparator component 440 comprises a first input 442 operably coupled to the first latch component 410, in particular in the illustrated example to the output 414 of the first latch component 410, and arranged to receive an indication of a current logical state of the first latch component 410. The comparator component 440 further comprises a second input 444 operably coupled to the second latch component 430, between the clocked transfer gate 436 and latch circuit 438 thereof. In this manner, the second input 444 of the comparator component 440 is arranged to receive an indication of a logical state of the first input 402 of the sequential logic circuit 400 when the second latch component 430 is in a transparent state. An output 446 of the comparator component 440 is arranged to provide an indication of whether the logical states of the signals received at the inputs 442, 444 thereof differ from one another.

As can be seen in the signal timing diagram 500 of FIG. 5, the output 446 of the comparator component 440 comprises a high logical state whenever the logical states of the two inputs 442, 444 thereof are not equal. Notably, when late data is received by the sequential logic circuit 400, the output 446 of the comparator component 440 comprises a high logical state upon the next falling clock edge of the clock signal 420, as illustrated at 590. Accordingly, by sampling and latching the output 446 of the sequential logic circuit 400 on the falling clock edge of the clock signal 420, the output 446 of the comparator component 440 may be used to provide the error detect signal 660 of a respective sequential logic component 620, 630, 640 of FIG. 6. The latching of the (or each) comparator output signal 446 of a sequential logic component 420, 430, 440 may be implemented either within the respective sequential logic component 420, 430, 440, or may be implemented at a later stage in the error detect network 665, or within the clock driver component 652. Alternatively, the output 446 may be filtered through a further AND gate, along the clock signal 420.

Referring back to FIG. 4, in the illustrated example, the sequential logic circuit 400 is configurable to operate in a further mode of operation in which the data input 412 of the first latch component 410 is operably coupled to a second input 406 of the sequential logic circuit 400, and the data input 432 of the second latch component 430 is operably coupled to the output 414 of the first latch component 410. In particular for the illustrated example, the data input 412 of the first latch component 410 is operably coupled to the second input 406 of the sequential logic circuit 400 via the first multiplexer component 450, and the data input 432 of the second latch component 430 is operably coupled to the output 414 of the first latch component 410 via the second multiplexer component 450. As previously mentioned, the first multiplexer component 450 is arranged to selectively output to the first latch component 410 a logical state of one of the first input 402 of the sequential logic circuit 400 and the second input 406 of the sequential logic circuit 400 in accordance with the control signal 460 received thereby, and the second multiplexer component 455 is arranged to selectively output to the second latch component 430 a logical state of one of the first input 402 of the sequential logic circuit 400 and the output 414 of the first latch component 410 in accordance with the control signal 460 received thereby. In this manner, when the sequential logic circuit 400 is configured to operate in the further operating mode, for example by way of the control signal 460 comprising, say, a logical '1' state, the first latch component 410 receives at its data input 412 a data signal received at the second input 406 of the sequential logic circuit 400, and the second latch component 430 receives at its data input 432 a data signal output by the first latch component 410. It will be appreciated that in this further operating mode, the first and second latch component 410, 430 are configured in a conventional flip-flop arrangement, and the second input 406 may be used for, say, a scan chain implementation.

In the illustrated example, the sequential logic circuit 400 further comprises a third latch component 470 comprising a data input/output 472 operably coupled to the second latch component 430, and a clock input 477 arranged to receive a clock signal, which in the illustrated example is the same clock signal 420 provided to the second latch component 430. The third latch component 470 is arranged to comprise a transparent state in which the third latch component 470 receives an indication of a current logical state of the second latch component 430 via the data input/output 472 thereof, upon the clock signal 420 received thereby comprising a first logical state, and a latched state in which the third latch component 470 outputs its current logical state to the second latch component 430 via the data input/output 472 thereof, upon the clock signal 420 received thereby comprising a second logical state. In this manner, the third latch component 470 enables a previous cycle logical state for the sequential logic circuit 400 to be maintained, for example during state retention power gating (SRPG) or the like.

Figure 7:
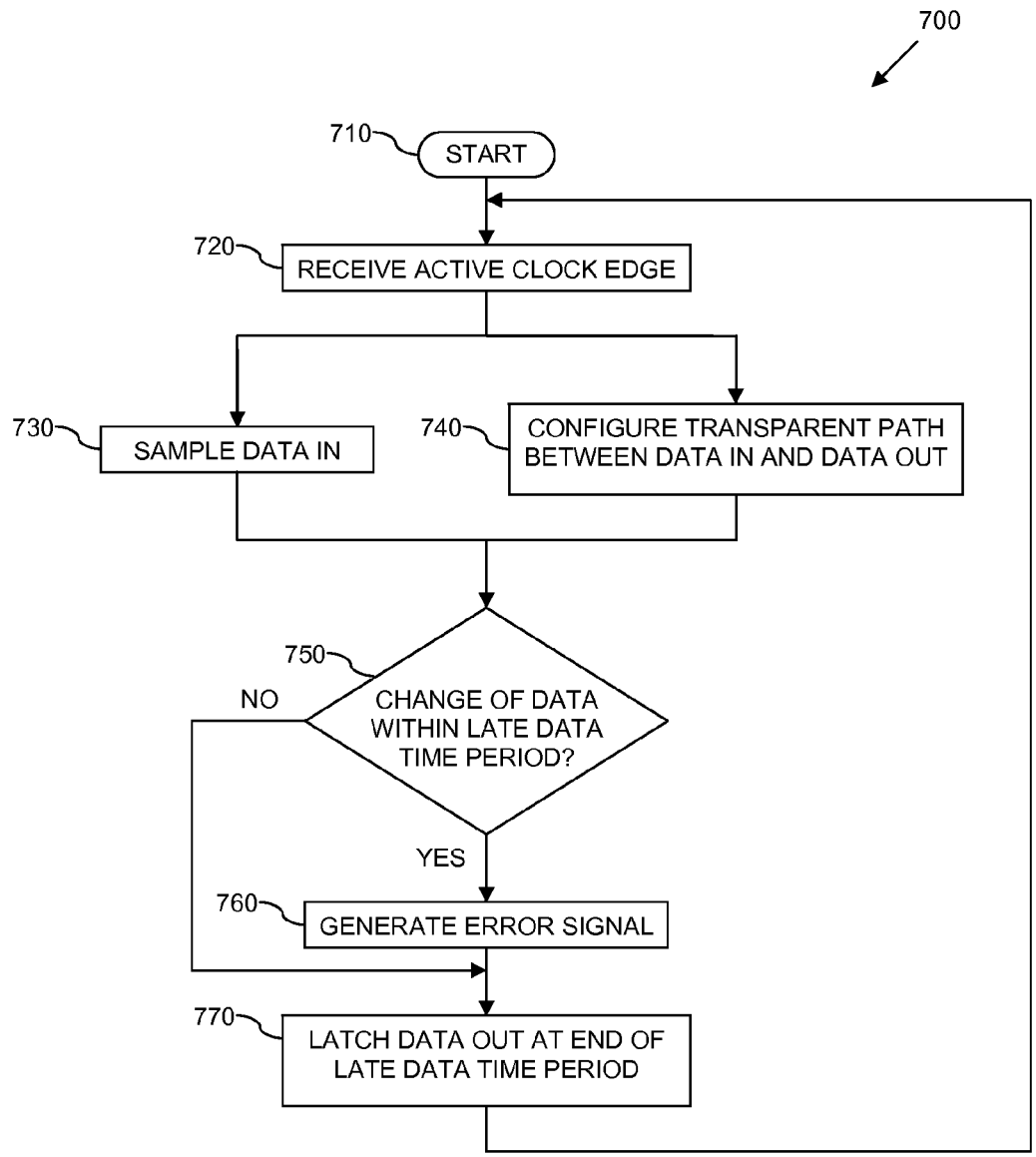
FIG. 7 illustrates a simplified flowchart of an example of a method of providing setup timing violation tolerance within a sequential logic circuit.

Referring now to FIG. 7, there is illustrated a simplified flowchart 700 of an example of a method of providing setup timing violation tolerance within a sequential logic circuit, such as may be implemented within the sequential logic circuit 400 of FIG. 4, and/or in one or more of the sequential logic components 620, 630, 640 of FIG. 6. The method starts at 710 and moves on to 720 with the receipt of an active clock edge, for example such as a rising clock edge in one example. Upon receipt of the active clock edge, the method moves on to sampling a logical state at an input of the sequential logic circuit at 730, for example as performed by the first latching component 410 of FIG. 4, and configuring a transparent path between the input and an output of the sequential logic circuit at 740, for example as performed by the second latching component 430 of FIG. 4. In this manner, the logical state at the input of the sequential logic circuit is sampled in order to enable the late arrival of data to be detected, whilst also enabling late data to be substantially immediately forwarded on within the relevant clock cycle.

Next, at 750, if a change of data is detected within a time period for receiving late data at 750, an error signal is generated at 760. At the end of the period for receiving late data, the method moves on to 760 where a logical state at the output of the sequential logic circuit is latched, for example as performed by the second latching component 430 of FIG. 4. In some examples, the time period for receiving late data may comprise a period equal to half a clock cycle period, for example whereby the output of the sequential logic circuit is latched upon receipt of a 'non-active' clock edge, for example such as a falling edge in the one example. The method then loops back to 720.

Thus, a sequential logic circuit, synchronous digital system comprising at least one such synchronous digital circuit and method therefor, have been described in which the sequential logic circuit comprises a first latch component comprising a data input arranged to receive an input signal, a data output arranged to output a current logical state of the first latch component and a clock input arranged to receive a clock signal; the first latch component being arranged to comprise a transparent state upon the clock signal received thereby comprising a first logical state, and to comprise a latched state upon the clock signal received thereby comprising a second logical state, and a second latch component comprising a data input arranged to receive an input signal, a data output operably coupled to an output of the sequential logic circuit and arranged to output a current state of the second latch component and a clock input arranged to receive a clock signal; the second latch component being arranged to comprise a transparent state upon the clock signal received thereby comprising a second logical state, and to comprise a latched state upon the clock signal received thereby comprising a first logical state. The sequential logic circuit is arranged to operate in at least a first operating mode in which the data input of the first latch component and the data input of the second latch component are operably coupled to a first input of the sequential logic circuit, and in which the clock signals provided to the first and second latch components are such that a transition of the second latch component from a transparent state to a latched state is delayed relative to a corresponding transition of the first latch component from a transparent state to a latched state for a time period for receiving late data.

In some examples, the sequential logic circuit may further comprise a comparator component, such as an eXclusive OR, XOR, gate, the comparator component being arranged to, at least when the sequential logic circuit is operating in the first operating mode and during the time period for receiving late data, receive at a first input thereof an indication of a latched logical state of the first latch component, receive at a second input thereof an indication of a logical state of the first input of the sequential logic circuit, and output from an output thereof an indication of whether the logical state of the first input of the sequential logic circuit differs from the latched logical state of the first latch component. For example, the second input of the comparator component may be operably coupled to the second latch component and arranged to receive an indication of a current logical state of the second latch component.

In some examples, the sequential logic circuit may be configurable to operate in at least one further mode of operation in which the data input of the first latch component is operably coupled to a second input of the sequential logic circuit. For example, the sequential logic circuit may comprise a first multiplexer component comprising a first data input operably coupled to the first input of the sequential logic circuit, a second data input operably coupled to the second input of the sequential logic circuit, an output operably coupled to the data input of the first latch component, and a control input arranged to receive a control signal. The first multiplexer component may be arranged to selectively output to the first latch component a logical state of one of the first input of the sequential logic circuit and the second input of the sequential logic circuit in accordance with the control signal received thereby.

In some examples, the sequential logic circuit may be configurable to operate in at least one further mode of operation in which the data input of the second latch component is operably coupled to the output of the first latch component. For example, the sequential logic circuit may comprise a second multiplexer component comprising a first data input operably coupled to the first input of the sequential logic circuit, a second data input operably coupled to the output of the first latch component, an output operably coupled to the data input of the second latch component, and a control input arranged to receive a control signal. The second multiplexer component may be arranged to selectively output to the second latch component a logical state of one of the first input of the sequential logic circuit and the output of the first latch component in accordance with the control signal received thereby.

In some examples, the sequential logic circuit may further comprise a third latch component comprising a data input/output operably coupled to the second latch component, and a clock input arranged to receive a clock signal. The third latch component may be arranged to comprise a transparent state in which the third latch component receives an indication of a current logical state of the second latch component via the data input/output thereof, upon the clock signal received thereby comprising a first logical state, and a latched state in which the third latch component outputs its current logical state to the second latch component via the data input/output thereof, upon the clock signal received thereby comprising a second logical state.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected', or 'operably coupled', to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A sequential logic circuit comprising:
a first latch component comprising a data input arranged to receive an input signal, a data output arranged to output a current logical state of the first latch component and a clock input arranged to receive a clock signal; the first latch component being arranged to comprise a transparent state upon the clock signal received thereby comprising a first logical state, and to comprise a latched state upon the clock signal received thereby comprising a second logical state; and a second latch component comprising a data input arranged to receive an input signal, a data output operably coupled to an output of the sequential logic circuit and arranged to output a current state of the second latch component and a clock input arranged to receive a clock signal; the second latch component being arranged to comprise a transparent state upon the clock signal received thereby comprising a second logical state, and to comprise a latched state upon the clock signal received thereby comprising a first logical state;

wherein the sequential logic circuit is arranged to operate in at least a first operating mode in which the data input of the first latch component and the data input of the second latch component are operably coupled to a first input of the sequential logic circuit, and in which the clock signals provided to the first and second latch components are such that a transition of the second latch component from a transparent state to a latched state is delayed relative to a corresponding transition of the first latch component from a transparent state to a latched state for a time period for receiving late data.

2. The sequential logic circuit of claim 1, wherein the same clock signal is provided to the first and second latch components.

3. The sequential logic circuit of claim 1, wherein the sequential logic circuit further comprises a comparator component, the comparator component being arranged to, at least when the sequential logic circuit is operating in the first operating mode and during the time period for receiving late data:

receive at a first input thereof an indication of a latched logical state of the first latch component;

receive at a second input thereof an indication of a logical state of the first input of the sequential logic circuit; and output from an output thereof an indication of whether the logical state of the first input of the sequential logic circuit differs from the latched logical state of the first latch component.

4. The sequential logic circuit of claim 3, wherein the second input of the comparator component is operably coupled to the second latch component and arranged to receive an indication of a current logical state of the second latch component.

5. The sequential logic circuit of claim 3, wherein the comparator component comprises an eXclusive OR, XOR, gate.

6. The sequential logic circuit of claim 1, wherein the sequential logic circuit is configurable to operate in at least one further mode of operation in which the data input of the first latch component is operably coupled to a second input of the sequential logic circuit.

7. The sequential logic circuit of claim 6, wherein the sequential logic circuit comprises a first multiplexer component comprising:

a first data input operably coupled to the first input of the sequential logic circuit;

a second data input operably coupled to the second input of the sequential logic circuit;

an output operably coupled to the data input of the first latch component; and a control input arranged to receive a control signal, wherein the first multiplexer component is arranged to selectively output to the first latch component a logical state of one of the first input of the sequential logic circuit and the second input of the sequential logic circuit in accordance with the control signal received thereby.

8. The sequential logic circuit of claim 1, wherein the sequential logic circuit is configurable to operate in at least one further mode of operation in which the data input of the second latch component is operably coupled to the output of the first latch component.

9. The sequential logic circuit of claim 8, wherein the sequential logic circuit comprises a second multiplexer component comprising:

a first data input operably coupled to the first input of the sequential logic circuit;

a second data input operably coupled to the output of the first latch component;

an output operably coupled to the data input of the second latch component; and a control input arranged to receive a control signal, wherein the second multiplexer component is arranged to selectively output to the second latch component a logical state of one of the first input of the sequential logic circuit and the output of the first latch component in accordance with the control signal received thereby.

10. The sequential logic circuit of claim 1, wherein the sequential logic circuit further comprises a third latch component comprising a data input/output operably coupled to the second latch component, and a clock input arranged to receive a clock signal; the third latch component being arranged to comprise:

a transparent state in which the third latch component receives an indication of a current logical state of the second latch component via the data input/output thereof, upon the clock signal received thereby comprising a first logical state; and a latched state in which the third latch component outputs its current logical state to the second latch component via the data input/output thereof, upon the clock signal received thereby comprising a second logical state.

11. The sequential logic circuit of claim 10, wherein the same clock signal is provided to the second and third latch components.

12. The sequential logic circuit of claim 1 implemented within an integrated circuit device comprising at least one die within a single integrated circuit package.

13. A digital synchronous system comprising at least one sequential logic circuit according to claim 1.

14. A method of providing setup timing violation tolerance within a sequential logic circuit, the method comprising, upon receipt of an active clock edge at the sequential logic circuit:

sampling a logical state of a data input of the sequential logic circuit;

configuring a transparent path between the data input of the sequential logic circuit and a data output of the sequential logic circuit during a time period for receiving late data following receipt of the active clock edge, said timer period for receiving late data being less than a clock cycle period; and latching the data output of the sequential logic circuit after expiry of the time period for receiving late data.

15. The method of claim 14, wherein the time period for receiving late data comprises a period equal to half a clock cycle period.

16. The method of claim 15, wherein the active clock edge comprises a transition of a logical state of a clock signal received by the sequential logic circuit from a first logical state to a second logical state, and the method comprises latching the data output of the sequential logic circuit upon a transition of a logical state of the clock signal from the second logical state to the first logical state.

17. The method of claim 14, wherein the method further comprises:
- comparing the sampled logical state of the data input of the sequential logic circuit with a logical state of the data input of the sequential logic circuit during the time period for receiving late data; and
- outputting an indication of whether the logical state of the data input of the sequential logic circuit differs from the sampled logical state during the time period for receiving late data.

\* \* \* \* \*